United States Patent
Srividya et al.

(10) Patent No.: US 8,378,430 B2
(45) Date of Patent: Feb. 19, 2013

(54) TRANSISTORS HAVING ARGON GATE IMPLANTS AND METHODS OF FORMING THE SAME

(75) Inventors: Cancheepuram V. Srividya, Leefdaal (BE); Suraj Mathew, Boise, ID (US); Dan Gealy, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 315 days.

(21) Appl. No.: 12/705,111

(22) Filed: Feb. 12, 2010

(65) Prior Publication Data

US 2011/0198708 A1    Aug. 18, 2011

(51) Int. Cl.
*H01L 27/11*    (2006.01)
*H01L 21/8244*  (2006.01)

(52) U.S. Cl. ........ 257/392; 257/324; 257/369; 257/411; 257/E21.409; 257/E21.632; 257/E27.099; 257/E29.255; 438/197; 438/287; 438/400; 438/591

(58) Field of Classification Search .................. 257/324, 257/369, 392, 411, E21.409, E21.632, E27.099, 257/E29.255; 438/197, 287, 400, 591
See application file for complete search history.

(56) References Cited

U.S. PATENT DOCUMENTS

| 5,459,089 | A | 10/1995 | Baliga |
| 6,525,377 | B1 | 2/2003 | Seliskar |
| 2002/0001906 | A1* | 1/2002 | Park ............................ 438/287 |
| 2008/0135902 | A1 | 6/2008 | Sinha et al. |
| 2008/0203488 | A1* | 8/2008 | Chung et al. .................. 257/369 |
| 2008/0246094 | A1* | 10/2008 | Liaw et al. .................... 257/392 |
| 2008/0299717 | A1 | 12/2008 | Winstead et al. |
| 2009/0039440 | A1* | 2/2009 | Hokazono .................... 257/372 |

* cited by examiner

*Primary Examiner* — Dao H Nguyen
(74) *Attorney, Agent, or Firm* — Dickstein Shapiro LLP

(57) ABSTRACT

Transistors are provided including first and second source/drain regions, a channel region and a gate stack having a first gate dielectric over a substrate, the first gate dielectric having a dielectric constant higher than a dielectric constant of silicon dioxide, and a metal material in contact with the first gate dielectric, the metal material being doped with an inert element. Integrated circuits including the transistors and methods of forming the transistors are also provided.

19 Claims, 2 Drawing Sheets

US 8,378,430 B2

TRANSISTORS HAVING ARGON GATE IMPLANTS AND METHODS OF FORMING THE SAME

TECHNICAL FIELD

Embodiments disclosed herein pertain to transistors, methods of forming the transistors and integrated circuits including transistors.

BACKGROUND OF THE INVENTION

Conventional MOS technology employs transistor gates including a metal over a doped polysilicon that is, in turn, over a gate dielectric. With the scaling of transistors to smaller sizes, the gate dielectric has transitioned from conventional silicon dioxide to higher-dielectric constant materials, such as hafnium dioxide ($HfO_2$) and hafnium silicon oxide (HfSiO), to achieve higher oxide capacitance.

The conventional polysilicon gate that was used with silicon dioxide is difficult to use with Hf-based dielectrics due to the interaction at the interface of the gate and gate dielectric and to fermi-level pinning. To overcome these problems, a metal gate, such as a transition metal nitride, is often used. However, a major drawback of using metal gates is the inability to tailor the work function of the metal gates. Consequently, it is difficult to achieve a low threshold voltage with metal gates.

One prior solution was to dope the metal gate with arsenic. Arsenic is a donor atom used for doping silicon. Accordingly, in an nMOS device, for example, an arsenic implant can result in channel counterdoping, which results in the degradation of the transistor's performance.

It is therefore desirable to achieve a metal-gated nMOS transistor having a lower threshold voltage without such disadvantages.

BRIEF DESCRIPTION OF THE DRAWINGS

Embodiments of the invention are described below with reference to the following accompanying drawings.

DETAILED DESCRIPTION OF THE PREFERRED EMBODIMENTS

In the following detailed description, reference is made to various embodiments that are described with sufficient detail to enable those skilled in the art to practice them. It is to be understood that other embodiments may be employed, and that various structural, logical and electrical changes may be made. Embodiments of the disclosure are now explained with reference to the figures. Throughout the figures, like reference numbers indicate like features.

In the context of the present document, "metal material" refers to a conductive material containing a metal compound or compounds (which compound may further include semimetals and/or nonmetals), an elemental metal, or a metal alloy. Elements considered to be metals in this document do not include semimetals. Accordingly, semimetals B, Si, As, Se, Te, and At are not considered to be metals. In the context of the present document, "work function" refers to the energy needed to pull an electron at its Fermi level into vacuum. "Fermi" level is the energy level at which a 50% probability exists of finding electrons at that energy level.

The term "substrate" used in the following description may include any supporting structure including, but not limited to, a semiconductor substrate that has an exposed substrate surface or a semiconductor substrate having one or more overlying material layers. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures, including those made of semiconductors other than silicon. When reference is made to a semiconductor substrate in the following description, previous process steps may have been utilized to form regions, junctions or material layers in or over the base semiconductor or foundation. The substrate also need not be formed of a semiconductor material, but may be any support structure suitable for supporting an integrated circuit, including, but not limited to, metals, alloys, glasses, polymers, ceramics, and any other supportive materials as is known in the art.

Figure 1:
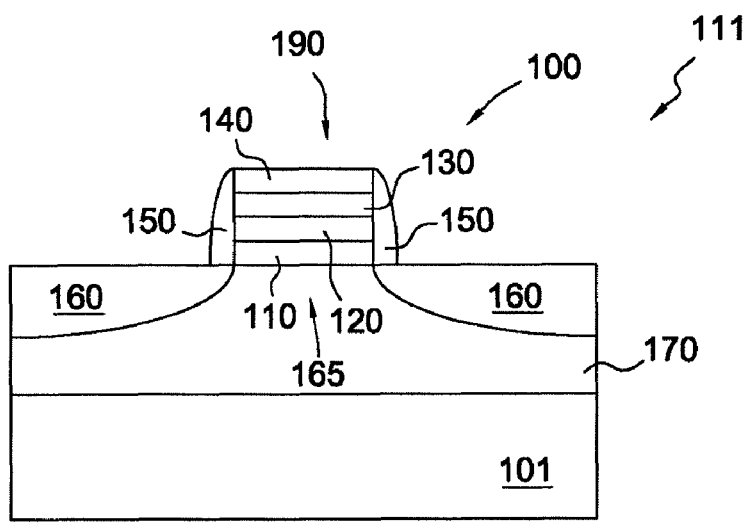
FIG. 1 depicts an integrated circuit including a transistor according to an embodiment described herein.

FIG. 1 depicts an integrated circuit 111 including a transistor 100. The transistor 100 is an nMOS transistor on a substrate 101 having a p-type region 170. Substrate 101 may be semiconductive. The transistor 100 includes n-type source/drain regions 160, channel region 165 and a gate stack 190. The gate stack 190 includes a gate dielectric 110, a high dielectric ("high-k") gate dielectric 120, a metal material 130, a cap material 140 and sidewall spacers 150.

The gate dielectric 110 is provided between the substrate 101 and the gate dielectric 120 and can be any suitable dielectric material. In one embodiment, the gate dielectric 110 is an oxide, such as silicon oxide. In one embodiment, the gate dielectric 110 is an in-situ steam generated (ISSG) oxide. The thickness of the gate dielectric 110 can be, for example, less than about 5 nm. In one embodiment, the gate dielectric 110 is about 1 nm thick.

The high-k gate dielectric 120 is a material having a dielectric constant higher than that of silicon dioxide, such as, e.g., a high dielectric constant material, such as a Hf-based dielectric (e.g., hafnium dioxide ($HfO_2$) and hafnium silicon oxide (HfSiO)). In one embodiment the high-k gate dielectric 120 is HfSiO, with Hf comprising about 60% of the atomic concentration of the gate dielectric 120. The thickness of the high-k gate dielectric 120 can be, for example, less than about 5 nm. In one embodiment the high-k gate dielectric 120 is between about 3 nm and about 4 nm thick. In one embodiment the high-k gate dielectric 120 is about 3.2 nm thick.

The metal material 130 is over the high-k gate dielectric 120 and can be, among other metal materials, any of the following: titanium, tantalum, tungsten, titanium nitride (TiN), tantalum nitride, tungsten nitride, aluminum nitride, titanium silicide, tantalum silicide, tungsten silicide, and tantalum silicon nitride. The metal material 130 may be also doped with an inert element, for example a noble gas, such as argon, neon, krypton, or xenon. In one embodiment the metal material 130 is TiN and is doped with Argon. In one embodiment, the thickness of the metal material 130 is between about 5 nm and about 15 nm. In one embodiment, the metal material 130 is about 10 nm.

In the illustrated embodiment, the metal material 130 is doped by an ion implantation process. In one embodiment, the implant dose is between about $1 \times 10^{14}$ atoms/cm$^2$ and about $1 \times 10^{16}$ atoms/cm$^2$. In another embodiment, the implant dose is between about $4 \times 10^{15}$ atoms/cm$^2$ and about $6 \times 10^{15}$ atoms/cm$^2$. In one embodiment the implant energy used is between about 1 keV and about 10 keV. In one embodiment the implant energy used is about 4 keV. In another embodiment the implant energy used is between about 3 keV and about 5 keV. In a further embodiment the implant energy used is about 4 keV.

The cap material 140 is over the metal material 130 and can be any suitable material, such as silicon. The thickness of the cap material 140 can be, for example, less than about 10 nm. In one embodiment the cap material 140 is about 5 nm.

The sidewall spacers 150 are on the lateral sidewalls of the stack of the gate dielectric 110, high-k gate dielectric 110, metal material 130 and cap material 140. The sidewall spacers 150 can be any suitable dielectric material, such as an oxide, e.g., silicon dioxide, silicon nitride, an oxynitride, ON, NO, ONO, or TEOS, among others.

By doping the metal material 130 with an inert element, the threshold voltage of the transistor 100 can be reduced. In addition, since an inert element is used, if the inert element reaches the channel region 165, it will not affect the active dopant concentration of the channel region 165. Further, the inert dopant can improve carrier mobility (as compared to no implant), which can improve transistor performance.

EXAMPLE

NMOS transistors having gate stacks consisting of the following materials, in order from the surface of a silicon substrate were formed: 1 nm ISSG silicon oxide, 3.2 nm HfSiO, 10 nm TiN formed by a physical vapor deposition process, 5 nm silicon. For each transistor, the channel doping was conducted with an implant dose of $2 \times 10^{12}$ atoms/cm$^2$. For the following transistors, the following additional dopant implants were conducted to dope the TiN gates:

A: none
B: Arsenic, $4 \times 10^{15}$ atoms/cm$^2$ dose with an implant energy of 6 keV
C: Arsenic, $6 \times 10^{15}$ atoms/cm$^2$ dose with an implant energy of 6 keV
D: Argon, $4 \times 10^{15}$ atoms/cm$^2$ dose with an implant energy of 3 keV
E: Argon, $4 \times 10^{15}$ atoms/cm$^2$ dose with an implant energy of 4 keV
F: Argon, $4 \times 10^{15}$ atoms/cm$^2$ dose with an implant energy of 5 keV
G: Argon, $6 \times 10^{15}$ atoms/cm$^2$ dose with an implant energy of 4 keV The gate bias to current characteristics were compared and the threshold voltages were extracted using to know methods (1) the constant current method and (2) the maximum slope method. When the threshold voltage was extracted using the constant current method, the threshold voltage for transistors B and C having an arsenic implant had a lower threshold voltage than transistors E and F that have an argon implant. However, when the threshold voltage was extracted using the maximum slope method, the threshold voltages for the transistors B and C having an arsenic implant are similar to the threshold voltages for the transistors E and F having an argon implant.

A threshold voltage reduction of about 250 mV was observed for transistors D, E and F as compared to transistor A. Transistor G, which received a higher argon implant dose, showed less of a threshold voltage reduction.

Carrier mobility for transistors D, E and F was about double that for transistor A. Carrier mobility for transistor G was greater than that of transistor A, but less than that of transistors D and F. Data showed that carrier mobility was independent of the implant energy used.

Figure 2A:
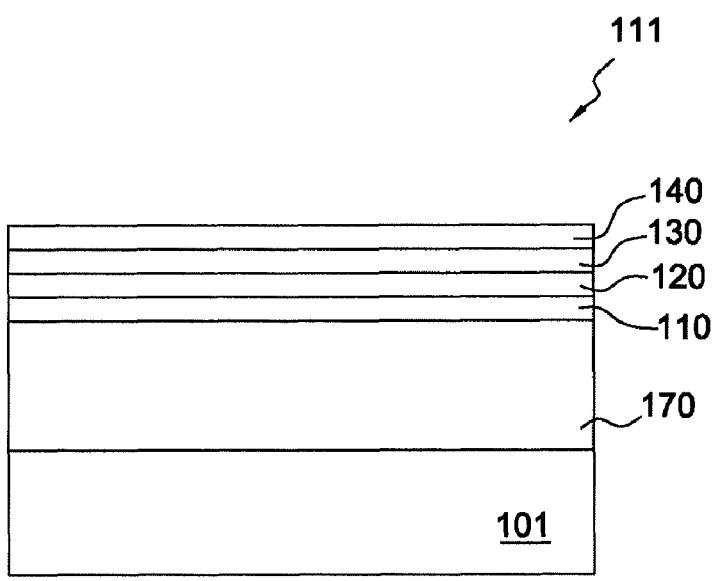
FIGS. 2A-2C depict the integrated circuit of FIG. 1 at various stages of processing.
Figure 2B:
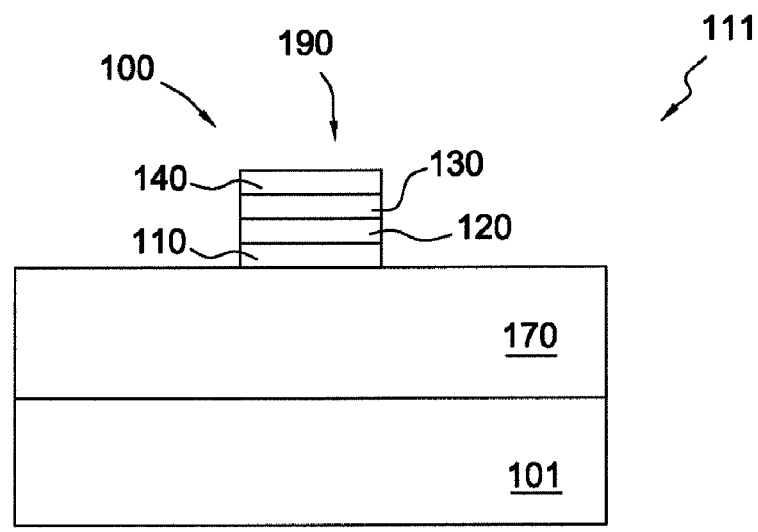
Figure 2C:
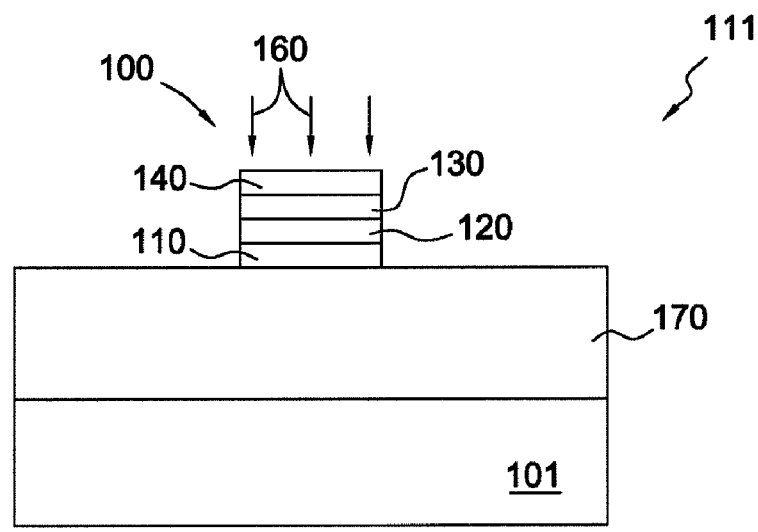

FIGS. 2A-2C show process stages leading to formation of the integrated circuit 111, having transistor 100 shown in FIG. 1. While the process stages are shown in a particular order, it should be appreciated that the order can be changed.

In FIG. 2A, a gate dielectric material 110 is formed on substrate 101 that includes a p-type region 170. A second dielectric material 120 is formed on the gate dielectric material 110, a metal material 130 is formed over the high-k gate dielectric material 120 and a cap material 140 is formed over the metal material 130.

Each of the gate dielectrics 110, 120, the metal material 130 and the cap material 140 can be formed by any suitable technique. In one embodiment, the gate dielectric 110 is formed by an ISSG process and is silicon dioxide. In one embodiment, the metal material 130 is formed by physical vapor deposition and is TiN.

In FIG. 2B, the gate dielectrics 110, 120, the metal material 130 and the cap material 140 are patterned and etched by any suitable technique to form a stack 190.

As depicted in FIG. 2C, the metal material 130 is doped with an inert gas, as represented by arrows 166. Alternatively, the metal material 130 can be doped prior to the patterning and etching process shown in FIG. 2B. As another alternative the metal material 130 can be doped immediately after formation of the metal material 130 and prior to the formation of the cap material 140.

In the illustrated embodiment, the metal material 130 is doped by an ion implantation process. In one embodiment, the implant dose is between about $1 \times 10^{14}$ atoms/cm$^2$ and about $1 \times 10^{16}$ atoms/cm$^2$. In another embodiment, the implant dose is between about $4 \times 10^{15}$ atoms/cm$^2$ and about $6 \times 10^{15}$ atoms/cm$^2$. In one embodiment the implant energy used is between about 1 keV and about 10 keV. In one embodiment the implant energy used is about 4 keV. In another embodiment the implant energy used is between about 3 keV and about 5 keV. In a further embodiment the implant energy used is about 4 keV.

The source/drain regions 160 and sidewall spacers 150 can be formed by suitable techniques to achieve the structure 100 depicted in FIG. 1. As is known, source/drain regions 160 can be formed by ion implantation. Sidewall spacers 150 can be formed by forming a dielectric material over the stack 190 and substrate 101 and etching the dielectric material leaving portions forming the sidewall spacers 150. In addition the channel region 165 can be doped, for example by an ion implantation process.

The above description and drawings should only be considered illustrative of example embodiments that achieve the features and advantages described herein. Modification and substitutions to specific process conditions and structures can be made. Accordingly, the claimed invention is not to be considered as being limited by the foregoing description and drawings, but is only limited by the scope of the appended claims.

What is claimed as new and desired to be protected by Letters Patent of the United States is:

1. An NMOS transistor comprising:
   a gate stack, the gate stack comprising:
   a first gate dielectric over a substrate, the first gate dielectric having a dielectric constant higher than a dielectric constant of silicon dioxide, and
   a metal in contact with the first gate dielectric, the metal material being doped with an inert element sufficient such that a threshold voltage of the transistor is less than a threshold voltage absent the inert element;
   first and second source/drain regions; and
   a channel region.

2. The transistor of claim 1, further comprising a second gate dielectric between the substrate and the first gate dielectric.

3. The transistor of claim 2, wherein the second gate dielectric is silicon oxide and has a thickness less than about 5 nm.

4. The transistor of claim 1, wherein the metal material comprises TiN.

5. The transistor of claim 1, wherein the inert element comprises a noble gas.

6. The transistor of claim 1, wherein the inert element comprises Argon.

7. The transistor of claim 1, wherein the metal material has a thickness between about 5 nm and about 15 nm.

8. The transistor of claim 1, wherein the first gate dielectric comprises HfSiO.

9. The transistor of claim 1, wherein the first gate dielectric comprises Hf.

10. The transistor of claim 1, wherein the first gate dielectric has a thickness less than about 5 nm.

11. The transistor of claim 1, further comprising a cap material over and in contact with the metal material.

12. The transistor of claim 11, wherein the cap material comprises silicon.

13. An NMOS transistor comprising:
a gate stack, the gate stack comprising:
a first gate dielectric in contact with a substrate, the first gate dielectric comprising silicon dioxide,
a second gate dielectric in contact with the first gate dielectric, the second gate dielectric comprising Hf and having a dielectric constant higher than a dielectric constant of silicon dioxide,
a metal material in contact with the gate dielectric, the metal material being doped with argon sufficient such that a threshold voltage of the transistor is less than a threshold voltage absent the argon, and
a cap material in contact with the metal material, the cap material comprising silicon;
first and second source/drain regions; and
a channel region.

14. The transistor of claim 13, wherein the metal material comprises a material from the group consisting of: titanium, tantalum, tungsten, titanium nitride, tantalum nitride, tungsten nitride, aluminum nitride, titanium silicide, tantalum silicide, tungsten silicide, and tantalum silicon nitride.

15. An integrated circuit comprising:
an NMOS transistor, the transistor comprising a gate stack, the gate stack comprising:
a first gate dielectric over substrate, the first gate dielectric having a dielectric constant higher than a dielectric constant of silicon dioxide, and
a metal material in contact with the first gate dielectric, the metal material being doped with an inert element sufficient such that a threshold voltage of the transistor is less than a threshold voltage absent the inert element;
first and second source/drain regions; and
a channel region.

16. The integrated circuit of claim 15, further comprising: a second gate dielectric between the substrate and the first gate dielectric, the second gate dielectric comprising silicon dioxide; and a cap material in contact with the metal material, the cap material comprising silicon.

17. The integrated circuit of claim 15, wherein the first gate dielectric comprises Hf.

18. The integrated circuit of claim 15, wherein the inert element comprises argon.

19. The transistor of claim 15, wherein the metal material comprises TiN.

* * * * *